(12) United States Patent
Yamashita

(10) Patent No.: US 11,075,320 B2
(45) Date of Patent: Jul. 27, 2021

(54) METHOD OF MANUFACTURING NITRIDE SEMICONDUCTOR LIGHT-EMITTING ELEMENT

(71) Applicant: NICHIA CORPORATION, Anan (JP)

(72) Inventor: Tomoya Yamashita, Anan (JP)

(73) Assignee: NICHIA CORPORATION, Anan (JP)

( * ) Notice: Subject to any disclaimer, the term of this patent is extended or adjusted under 35 U.S.C. 154(b) by 172 days.

(21) Appl. No.: 15/888,627

(22) Filed: Feb. 5, 2018

(65) Prior Publication Data

US 2018/0226536 A1 Aug. 9, 2018

(30) Foreign Application Priority Data

Feb. 6, 2017 (JP) .............................. JP2017-019717

(51) Int. Cl.
*C30B 25/02* (2006.01)
*C30B 29/40* (2006.01)
(Continued)

(52) U.S. Cl.
CPC .............. *H01L 33/04* (2013.01); *C30B 25/02* (2013.01); *C30B 29/403* (2013.01);
(Continued)

(58) Field of Classification Search
CPC ...................................................... H01L 33/04
See application file for complete search history.

(56) References Cited

U.S. PATENT DOCUMENTS

| 6,172,382 B1* | 1/2001 | Nagahama | ............. | B82Y 20/00 |
| | | | | 257/103 |
| 7,547,925 B2* | 6/2009 | Wong | ..................... | B82Y 20/00 |
| | | | | 257/103 |

(Continued)

FOREIGN PATENT DOCUMENTS

| JP | 2013-012683 A | 1/2013 |
| JP | 2015-109383 A | 6/2015 |
| JP | 2016-092253 A | 5/2016 |

OTHER PUBLICATIONS

Saxler et al., Comparison of trimethylgallium and triethylgallium for the growth of GaN, Appl. Phys. Lett. 71:22, 3272-3274 (1997).*

(Continued)

*Primary Examiner* — Erik T. K. Peterson
(74) *Attorney, Agent, or Firm* — Foley & Lardner LLP

(57) ABSTRACT

A method of manufacturing a nitride semiconductor light-emitting element includes: growing an n-side superlattice layer that includes InGaN layers and GaN layers; and, after the step of growing the n-side superlattice layer, growing a light-emitting layer. The step of growing the n-side superlattice layer comprises repeating a cycle n times (n is a number of repetition), the cycle including growing one InGaN layer and growing one GaN layer. In the step of growing the n-side superlattice layer, the step of growing one GaN layer in each cycle from a first cycle to an mth cycle is performed using carrier gas that contains $N_2$ gas and does not contain $H_2$ gas. The step of growing one GaN layer in each cycle from a (m+1)th cycle to an nth cycle is performed using gas containing $H_2$ gas as the carrier gas.

11 Claims, 1 Drawing Sheet

(51) Int. Cl.
- *H01L 21/02* (2006.01)
- *H01L 33/00* (2010.01)
- *H01L 33/04* (2010.01)
- *H01L 33/06* (2010.01)
- *H01L 33/12* (2010.01)
- *H01L 33/32* (2010.01)
- *H01L 21/205* (2006.01)

(52) U.S. Cl.
CPC ...... *H01L 21/0254* (2013.01); *H01L 21/0262* (2013.01); *H01L 21/02458* (2013.01); *H01L 21/2056* (2013.01); *H01L 33/007* (2013.01); *H01L 33/0025* (2013.01); *H01L 33/0075* (2013.01); *H01L 33/06* (2013.01); *H01L 33/12* (2013.01); *H01L 33/32* (2013.01)

(56) References Cited

U.S. PATENT DOCUMENTS

| | | | | |
|---|---|---|---|---|
| 2006/0246612 | A1* | 11/2006 | Emerson | H01L 33/24 438/22 |
| 2007/0063207 | A1* | 3/2007 | Tanizawa | B82Y 20/00 257/94 |
| 2008/0093610 | A1* | 4/2008 | Lee | H01L 33/02 257/94 |
| 2009/0057695 | A1* | 3/2009 | Nakahara | H01L 33/04 257/94 |
| 2010/0044674 | A1* | 2/2010 | Kim | H01L 33/04 257/13 |
| 2010/0065812 | A1* | 3/2010 | Nakahara | H01L 33/04 257/13 |
| 2011/0140083 | A1* | 6/2011 | Driscoll | H01L 21/0237 257/15 |
| 2011/0187294 | A1* | 8/2011 | Bergmann | H01L 33/04 315/363 |
| 2011/0240957 | A1* | 10/2011 | Okuno | H01L 33/04 257/13 |
| 2011/0284824 | A1* | 11/2011 | Liu | H01L 33/04 257/13 |
| 2012/0126201 | A1* | 5/2012 | Liu | H01L 21/0262 257/13 |
| 2012/0217471 | A1* | 8/2012 | Shioda | H01L 33/06 257/13 |
| 2013/0001509 | A1 | 1/2013 | Fudeta et al. | |
| 2013/0248818 | A1* | 9/2013 | Choi | H01L 33/0062 257/13 |
| 2015/0255669 | A1* | 9/2015 | Han | H01L 33/04 257/13 |
| 2015/0255673 | A1 | 9/2015 | Fudeta et al. | |
| 2016/0133783 | A1 | 5/2016 | Nagata et al. | |
| 2017/0025568 | A1* | 1/2017 | Ji | H01L 33/32 |
| 2017/0092807 | A1* | 3/2017 | Okuno | H01L 33/14 |

OTHER PUBLICATIONS

Saxler et al., Comparison of trimethylgallium and triethylgallium for the growth of GaN, Appl. Phys. Lett. 71:22, 3272-3274 (1997). (Year: 1997).*

* cited by examiner

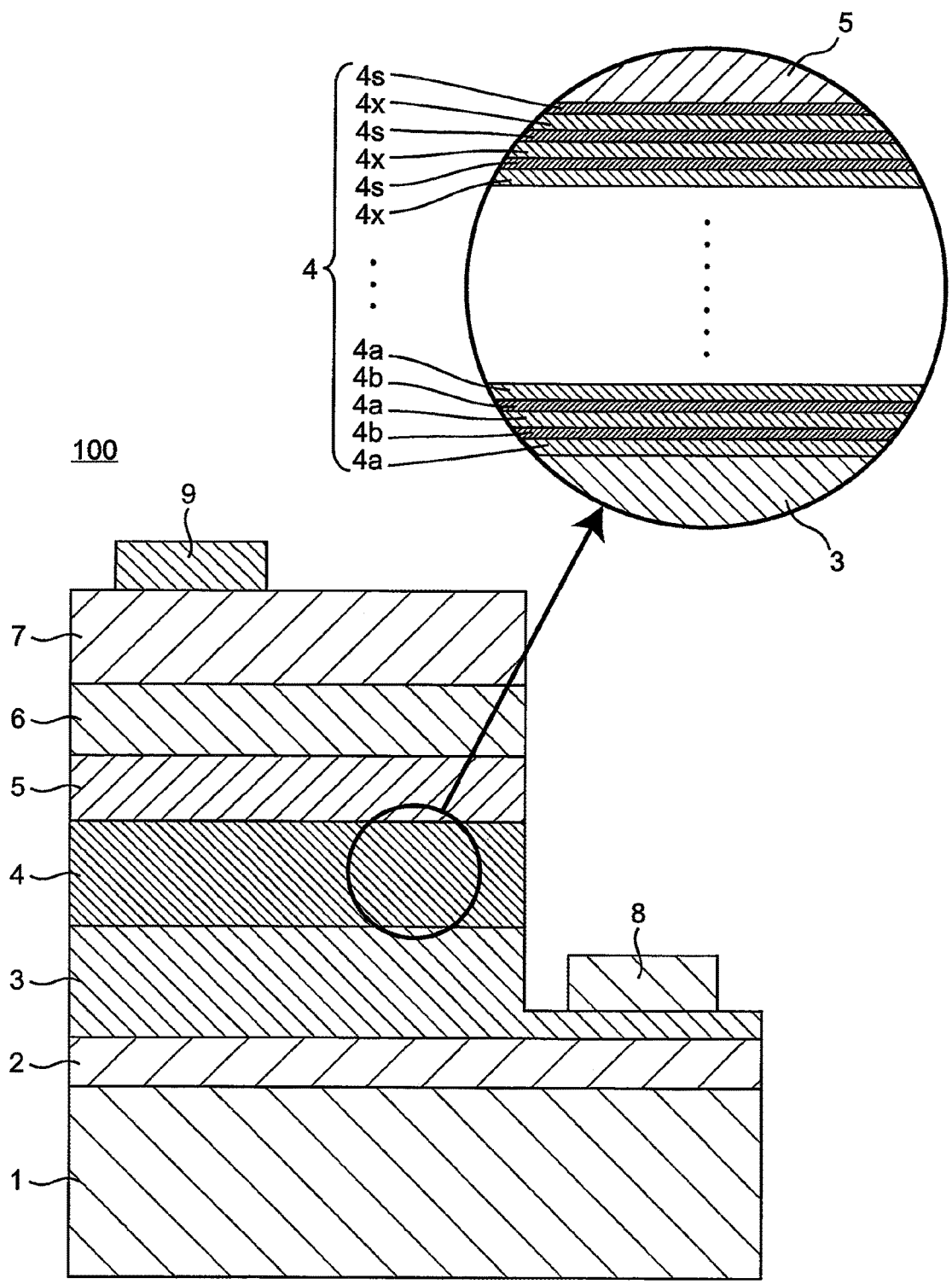

METHOD OF MANUFACTURING NITRIDE SEMICONDUCTOR LIGHT-EMITTING ELEMENT

CROSS-REFERENCE TO RELATED APPLICATION

This application claims priority to Japanese Patent Application No. 2017-019717, filed on Feb. 6, 2017, the disclosure of which is hereby incorporated by reference in its entirety.

BACKGROUND

The present disclosure relates to a method of manufacturing a nitride semiconductor light-emitting element.

In recent years, semiconductor light-emitting elements, such as light-emitting diodes, have been used for a wide variety of applications, including various types of illumination devices. Accordingly, such light emitting elements are required to emit light with a high brightness at a low drive voltage. To meet such a requirement, for example, JP 2016-92253 A discloses a method for manufacturing a light-emitting element that can emit light with a high brightness. In JP 2016-92253 A, a method of manufacturing a nitride semiconductor light-emitting element is described in which an n-side layer includes an n-side superlattice layer. In a step of forming the n-side superlattice layer, an InGaN layer, a GaN layer on the InGaN layer, and an n-type GaN layer on the GaN layer are repeatedly formed. When forming the InGaN layer, nitrogen gas is used as the carrier gas. When forming the n-type GaN layer, a mixed gas in which nitrogen gas and hydrogen gas are mixed is used as the carrier gas.

SUMMARY

In the light-emitting element manufactured by using the method described in JP 2016-92253 A, it is possible to improve brightness to some extent, but forward voltage Vf tends to be increased.

Accordingly, it is an object of certain embodiments of the present disclosure to provide a method of manufacturing a nitride semiconductor light-emitting element in which the brightness thereof can be improved while reducing an increase in the forward voltage Vf.

According to one embodiment, a method of manufacturing a nitride semiconductor light-emitting element includes: growing an n-side superlattice layer that includes InGaN layers and GaN layers; and, after the step of growing the n-side superlattice layer, growing a light-emitting layer. The step of growing the n-side superlattice layer comprises repeating a cycle n times (n is a number of repetition), the cycle including growing one InGaN layer and growing one GaN layer. In the step of growing the n-side superlattice layer, the step of growing one GaN layer in each cycle from a first cycle to an mth cycle is performed using carrier gas that contains $N_2$ gas and does not contain $H_2$ gas. The step of growing one GaN layer in each cycle from a (m+1)th cycle to an nth cycle is performed using gas containing $H_2$ gas as the carrier gas.

The method of manufacturing a nitride semiconductor light-emitting element according to certain embodiments described herein can produce a nitride semiconductor light-emitting element which improves the brightness while reducing an increase in the forward voltage Vf.

BRIEF DESCRIPTION OF THE DRAWINGS

FIG. 1 is a cross-sectional view showing the structure of a light-emitting element according to one embodiment.

DETAILED DESCRIPTION

Nitride semiconductor light-emitting elements according to certain embodiments will be described below with reference to the accompanying drawing.

A nitride semiconductor light-emitting element 100 according to the one embodiment includes: a substrate 1; an underlayer 2 on the substrate; an n-side contact layer 3; an n-side superlattice layer 4; an active layer 5; a p-side cladding layer 6; and a p-side contact layer 7, which are layered in this order from the side of the substrate 1. The n-side superlattice layer 4 includes n pairs of InGaN layers and GaN layers, each pair including a single InGaN layer and a single GaN layer. Hereinafter, the "pairs of InGaN layers and GaN layers, each pair including a single InGaN layer and a single GaN layer" may be referred to simply as "pairs". In the n-side superlattice layer 4, GaN layers 4a, each of which is the single GaN layer, in each of m pairs of the n pairs from the underlayer 2 side, are grown using $N_2$ gas, which does not contain hydrogen, as the carrier gas. The GaN layers 4x, each of which is the single GaN layer in each pair from the (m+1)th pair to the nth pair of then pairs, i.e., at the active layer 5 side, are grown using gas, which contains $H_2$ gas, as the carrier gas. In the n-side superlattice layer 4, preferably, InGaN layers 4b, each of which is the single GaN layer in each of k pairs of the n pairs from the underlayer 2 side, are undoped layers not doped with n-type impurities. Preferably, the InGaN layers 4s, each of which is the single GaN layer in each pair from the (k+1)th pair to the nth pair of the n pairs, are layers containing n-type impurities. As shown in FIG. 1, in the n-side superlattice layer 4, for example, the layer closest to the underlayer 2 is the GaN layer 4a, and the layer closest to the active layer 5 is the InGaN layer 4s. The active layer 5 formed on the n-side superlattice layer 4 includes well layers and barrier layers that are alternately formed. For example, the active layer 5 is disposed on the n-side superlattice layer 4 such that the barrier layer included in the active layer is in contact with the InGaN layer 4s disposed closest to the active layer 5 in the n-side superlattice layer 4. The p-side cladding layer 6 and the p-side contact layer 7 are formed in this order on the active layer 5. As used herein, "n" is an integer greater than 2, "m" is an integer greater than 0 and smaller than n, and "k" is an integer greater than 0 and smaller than n. The expression "from the (m+1) th pair to the nth pair" as used herein, includes the case of m=n−1, i.e. , the expression "from the (m+1) th pair to the nth pair" may indicate only the nth pair, that is, the pair closest to the active layer 5. The expression "from the (k+1) th pair to the nth pair" as used herein includes the case of k=n−1, i.e. , the expression "from the (k+1) th pair to the nth pair" may indicate only the nth pair, that is, the pair closest to the active layer 5.

A p-electrode 9 is disposed on a part of the surface of the p-side contact layer 7. An n-electrode 8 is disposed on a surface (i.e., electrode formation surface) of the n-side contact layer 3 exposed by removing a portion of each of the p-side contact layer 7, the p-side cladding layer 6, and the active layer 5, in a predetermined region.

Examples of nitride semiconductors in the nitride semiconductor light-emitting element according to the present embodiment include group III-V nitride semiconductors $(In_xAl_yGa_{1-x-y}N$ $(0≤X, 0≤Y, X+Y≤1))$ . The group III-V nitride semiconductor may be a mixed crystal in which B is used for a part of the group III element, or P, As, or Sb is substituted for a part of N of the group V element. Such a nitride semiconductor layer can be formed, for example, by metal-organic chemical vapor deposition (MOCVD), hydridevaporphaseepitaxy(HVPE),molecular beam epitaxy (MBE), or the like.

In the nitride semiconductor light-emitting element with the configuration mentioned above, an active layer with better crystallinity can be formed; thus an emission output can be increased and an increase in the forward voltage Vf can be reduced or prevented. These effects can be greatly exhibited in the nitride semiconductor light-emitting element in which the active layer 5 includes a well layer containing a relatively large amount of In and which has an emission peak wavelength of 500 nm or greater (for example, the light emitting element configured to emit green light and includes the well layer made of InGaN in which an In content is approximately 20.0 to 25.0%). The expression "A-B", where "A" and "B" are numbers, as used herein refers to a range of A to B in which A and B is included.

A description will be given below of respective components of the nitride semiconductor light-emitting element obtained by a method of manufacturing according to the present embodiment.

Substrate 1

An insulating substrate made of, for example, sapphire or spinel ($MgAl_2O_4$) in which any one of the C plane, the R plane, and the A plane is a main surface can be used as the substrate 1 on which a semiconductor layer is to be formed. Among these, the sapphire substrate is preferable. Examples of a material suitable for the substrate 1 may include SiC (examples thereof including 6H, 4H, and 3C), ZnS, ZnO, GaAs, and Si. The substrate 1 may or may not be removed at the end of manufacturing.

n-Side Contact Layer 3

The n-side contact layer 3 contains n-type impurities in at least a part thereof and serves to supply and diffuse carriers in the electrode formation surface and into a light-emitting layer. In particular, in order to supply the carriers from the n-electrode 8 toward the active layer 5 through in-plane diffusion, the n-side contact layer 3 is preferably doped with n-type impurities at a relatively highly concentration. The n-side contact layer 3 is preferably made of GaN.

n-Side Superlattice Layer 4

The n-side superlattice layer 4 is disposed to improve the crystallinity of the active layer 5 and the like formed thereon. As described above, the n-side superlattice layer includes n pairs of InGaN layers and GaN layers, each pair including a single InGaN layer and a single GaN layer. The "n" represents the number of the pairs, and is, for example, in a range of 10 to 40, preferably 15 to 35, and more preferably 25 to 35. For example, a nitride semiconductor light-emitting element configured to emit blue light, where the In content in a well layer of the active layer 5 is relatively small, includes 20 pairs of the InGaN layers and the GaN layers. A nitride semiconductor light-emitting element configured to emit green light, where the In content in the well layer of the active layer 5 is relatively large, includes 30 pairs of the InGaN layers and the GaN layers. Each of the GaN layers 4a and 4x preferably has a thickness of 1.5 nm to 5 nm, and more preferably 2 nm to 4 nm. Each of the InGaN layers 4b and 4s preferably has a thickness of 0.5 nm to 3 nm, and more preferably 0.7 nm to 2 nm. The thicknesses of the GaN layers 4a and 4x and the InGaN layers 4b and 4s may differ among the pairs. For example, the thickness of the GaN layer 4a on the n-side contact layer 3 side may differ from the thickness of the GaN layer 4x on the active layer 5 side. Likewise, the thickness of the InGaN layer 4b on the n-side contact layer 3 side may differ from the thickness of the InGaN layer 4s on the active layer 5 side.

As described above, in the n-side superlattice layer 4, the GaN layers 4a in m pairs from the underlayer 2 side are grown using $N_2$ gas, which does not contain hydrogen, as the carrier gas, and the GaN layers 4x in pairs from the (m+1)th pair to the nth pair, that is, on the active layer 5 side are grown using gas, which contains $H_2$ gas, as the carrier gas. The number of pairs of InGaN layers and GaN layers grown on the active layer 5 side using gas containing $H_2$ gas as the carrier gas is expresses as (n–m), and is preferably in a range of 1 to 5, more preferably 2 to 4, and even more preferably 2 or 3. With the number of (n–m), which indicates the number of pairs of InGaN layers and GaN layers grown on the active layer 5 side using gas containing $H_2$ gas as the carrier gas, of 1 or greater, a surface of the GaN layer 4a is less likely to have a large recess (i.e., V-shaped pit), and thus can be more flat, and the crystallinity of the GaN layers 4a can be improved. Consequently, the active layer 5 can be formed favorably on the upper surface of the GaN layer 4a. It is considered that growing the GaN layer 4a while supplying gas containing $H_2$ gas as the carrier gas allows the growth in the lateral direction of the GaN layer 4a to be accelerated, which allows for preventing increase in size of the recess formed on the surface of the GaN layer 4a, so that a large recess is not easily formed in the surface of the GaN layer 4a. With the number of (n–m), which indicates the number of the pairs on the active layer 5 side grown by using gas containing $H_2$ gas as the carrier gas, of 5 or less, the brightness of the light-emitting element can be improved without excessively increasing the forward voltage Vf.

In contrast, in the n-side superlattice layer 4, if the GaN layers 4a in several pairs from the underlayer 2 side, not from the active layer 5 side, are grown using gas containing $H_2$ gas as the carrier gas, the brightness is hardly improved, and the forward voltage Vf tends to increase. This is considered to be due to that, in the n-side superlattice layer 4, improvement in a surface state of the GaN layer 4a on the underlayer 2a side does not allow a surface of the GaN layer 4a on which the active layer 5 is to be formed to be a flat surface, so that the active layer 5 is not efficiently formed.

As described above, in the n-side superlattice layer 4, preferably, the InGaN layers 4b in the k pairs from the underlayer 2 side are undoped layers, i.e., not doped with n-type impurities, whereas the InGaN layers 4s in pairs from the (k+1)th pair to the nth pair are layers containing n-type impurities. The number of pairs on the active layer 5 side that include the InGaN layers 4s containing n-type impurities is indicated by (n–k), and is preferably in a range of 2 to 5, and more preferably 3 or 4. With the number of (n–k), which indicates the number of pairs on the active layer 5 side that include the InGaN layers 4s containing n-type impurities, of 2 or more, the effect of reducing the forward voltage Vf by containing n-type impurities in the superlattice layer can be efficiently obtained, and an increase in the forward voltage Vf can be prevented. Further, with the number of (n–k), which indicates the number of pairs on the side of the active layer 5 that include the InGaN layers 4s containing n-type impurities, of 5 or less, deterioration of the superlattice layer due to the contained n-type impurities can be prevented, while reducing or preventing an increase in the forward voltage Vf, so that electrostatic resistance can be maintained.

In the n-side superlattice layer 4, if the InGaN layers 4b in several pairs from the side of the underlayer 2, not from the active layer 5 side, contain n-type impurities, electrostatic resistance of the light emitting element can be improved, but its forward voltage Vf and brightness tends to deteriorate. This is considered to occur because no layer that contains n-type impurities is formed on the active layer 5 side in the n-side superlattice layer 4, and thus carriers are less likely to be injected into the active layer 5.

The n-type impurity concentration of the InGaN layers 4s from the (k+1)th pair to the nth is preferably in a range of $1\times10^{18}/cm^3$ to $5\times10^{18}/cm^3$, and more preferably $2\times10^{18}/cm^3$ to $4\times10^{18}/cm^3$.

Further, in the n-side superlattice layer 4, the number of (n−k), which indicates the number of pairs on the active layer 5 side that include the InGaN layers 4s containing the n-type impurities, is preferably larger than the number of (n−m), which indicates the number of pairs on the active layer 5 side that include the GaN layers grown by using gas containing $H_2$ gas as the carrier gas.

In the nitride semiconductor light-emitting element containing the n-side superlattice layer with the structure described above, the crystallinity of the active layer 5 can be improved, and the in-plane current diffusion when driven can be enhanced, so that its electrostatic resistance can be improved. Therefore, in the nitride semiconductor light-emitting element according to the present embodiment, brightness can be improved without increasing the forward voltage Vf, and the electrostatic resistance characteristics can be maintained.

Active Layer 5

A nitride semiconductor containing In is preferably used for the active layer 5. With the appropriate proportion of In, the nitride semiconductor light-emitting element can emit the light in the range of ultraviolet region to the visible light (red light) region, and can also achieve high luminous efficiency. For example, when the well layer is made of $In_xGa_{1-x}N$, the In composition x is selected so as to obtain a desired emission color. The emission wavelength of the nitride semiconductor light-emitting element is selected such that a peak emission peak wavelength is in a range of 430 nm to 570 nm, preferably 500 nm to 570 nm. The barrier layer can be made of, for example, GaN, InGaN, AlGaN, or the like. The well layer and the barrier layer may contain n-type impurities such as Si, and/or p-type impurities such as Mg, or otherwise may be undoped.

p-Side Cladding Layer 6

The p-side cladding layer 6 served to confine carriers therein. For example, the p-side cladding layer 6 can be made of GaN, AlGaN, or the like that contains p-type impurities such as Mg. The p-side cladding layer 6 has a thickness of 10 nm to 30 nm, for example.

p-Side Contact Layer 7

The p-side contact layer 7 is a layer having an upper surface on which an electrode is formed. For example, the p-side contact layer 7 can be made of GaN, AlGaN, or the like that contains p-type impurities such as Mg. The p-side contact layer 7 has a thickness of 100 nm to 150 nm, for example.

A method of manufacturing the nitride semiconductor light-emitting element according to the present embodiment will be described below.

Forming Underlayer

The underlayer 2 is formed, for example, on a C-plane of the substrate 1 made of sapphire by the metal-organic chemical vapor deposition (MOCVD) via a buffer layer.

The buffer layer is formed, for example, by growing AlGaN on the substrate using raw material gas, such as trimethylaluminum (TMA), trimethylgallium (TMG), or ammonia, at a low temperature of 600° C. or lower.

The underlayer 2 is formed, for example, by growing GaN on the buffer layer using TMG and ammonia as the raw material gas. The underlayer 2 maybe formed to be multiple layers that include, for example, a first layer grown at 1050° C. and a second layer grown at 1,150° C.

Forming n-Side Contact Layer

Then, the n-side contact layer 3 is formed, for example, by growing an n-type GaN, which contains n-type impurities made of Si, on the underlayer 2 at a temperature of 1,150° C. using TMG and ammonia as the raw material gas and using monosilane as n-type impurity gas.

Forming n-Side Superlattice Layer

Then, the n-side superlattice layer 4 is formed, for example, by alternately growing a GaN layer an InGaN layer at 860° C., which is lower than the temperature at which the n-side contact layer 3 is grown.

Regarding each pair, when growing the GaN layer, in the first cycle to the mth cycle for formation of the m pairs from the n-side contact layer 3 side, the GaN layer is grown using triethylgallium (TEG) and ammonia as the raw material gas and $N_2$ gas as the carrier gas, whereas in the (m+1)th cycle to the nth cycle (i.e., final cycle) for formation of the (n−m) pairs on the active layer 5 side, the GaN layer is grown using TEG and ammonia as the raw material gas and $H_2$ gas as the carrier gas. It is preferable that only $H_2$ gas is used as the carrier gas used for growing the GaN layer in the (m+1)th cycle to the nth cycle. Using only $H_2$ gas allows for easily obtaining the above-mentioned effects, such as suppressing an increase in size of a V-shaped pit at the GaN layer 4a. The expression "the (m+1)th cycle to the nth cycle" as used herein includes the case of m=n−1, i.e. , the case where "the (m+1)th cycle to the nth cycle" indicated only the final cycle.

Regarding each pair, when growing the InGaN layer, in the first cycle to the kth cycle for formation of the k pairs from the n-side contact layer 3 side, the InGaN layer 4b is grown using TEG, TMI, and ammonia as the raw material gas and $N_2$ gas as the carrier gas without supplying any n-type impurity gas, whereas in the (k+1)th cycle to the nth cycle (final cycle) for formation of the (n−k) pairs on the side of the active layer 5, the InGaN layer 4s is grown using TEG, TMI, and ammonia as the raw material gas to which the n-type impurity gas supplied and $N_2$ gas as the carrier gas. At the time of growing the InGaN layers 4b and 4s, the concentration of the n-type impurity gas is set such that the In proportion in each of the InGaN layers 4b and 4s is preferably in a range of 1% to 10% and more preferably 1% to 3%. The term "the (k+1)th cycle to the nth cycle" as used herein includes the case of k=n−1, i.e., the case where "the (k+1)th cycle to the nth cycle" indicates only the final cycle.

Forming Active Layer 5

Then, for example, a barrier layer made of GaN is grown on the n-side superlattice layer 4 at a temperature of 950° C., and subsequently a well layer made of InGaN is grown on the barrier layer at a temperature of 800° C., by using TEG, TMI, and/or ammonia as the raw material gas.

These barrier and well layers are alternately grown, and finally the barrier layer made of GaN is grown, so that the active layer 5 is formed.

Forming p-Side Cladding Layer 6

Then, the p-side cladding layer 6 is formed, for example, by growing p-type AlGaN that contains p-type impurities of Mg on the active layer 5 by using TEG and ammonia as the raw material gas and using $Cp_2Mg$ (cyclopentadienyl magnesium) as p-type impurity gas.

Forming p-Side Contact Layer 7)

Subsequently, for example, an undoped GaN layer is grown on the p-side cladding layer 7 by using TMG, TMA, and ammonia as the raw material gas. Then, p-type GaN containing p-type impurities of Mg is grown on the undoped GaN layer by using TMG, TMA, and ammonia as the raw material gas and Cp$_2$Mg (cyclopentadienyl magnesium) as the p-type impurity gas, so that the p-side contact layer 7 is formed. The concentration of impurities in the p-side contact layer 7 is preferably higher than that in the p-side cladding layer 6.

After the growth, a wafer is placed in a reactor vessel under a nitrogen atmosphere and subjected to annealing at a temperature of about 700° C., which is lower than the temperature at which the above-mentioned respective layers are grown, so that the resistance of each of the p-side cladding layer 6 and the p-side contact layer 7 can be reduced.

After the annealing, a portion of each of the p-side contact layer 7, the p-side cladding layer 6, and the active layer 5 in the certain region are removed to expose the surface (electrode formation surface) for forming the n-electrode 8.

Then, the p-electrode 9 and the n-electrode 8 are formed on the part of the surface of the p-side contact layer 7 and on the electrode formation surface, respectively.

Through the steps described above, the nitride semiconductor light-emitting element is manufactured.

Examples of the present invention will be described below.

EXAMPLES

Example 1

A nitride semiconductor light-emitting element was manufactured by a method of manufacturing as described below.

Substrate 1

A substrate made of sapphire was used as the substrate 1. A sapphire (C-plane) for growing a nitride semiconductor was cleaned at a temperature of 1,050° C. under a hydrogen atmosphere in a metal organic chemical vapor deposition (MOCVD) reactor vessel.

Buffer Layer

A buffer layer made of AlGaN, was grown on the substrate at a temperature of 550° C. to have a thickness of approximately 12 nm, using TMA, TMG, and ammonia as the raw material gas.

Underlayer 2

GaN was grown to have a thickness of appropriately 1 μm on the buffer layer at a temperature of 1, 050° C. using TMG and ammonia as the raw material gas. Subsequently, on this layer, GaN was further grown to have a thickness of appropriately 1 μm at a temperature of 1,150° C. using TMG and ammonia as the raw material gas. The two GaN layers grown in this way is collectively referred to as the "underlayer 2".

n-Side Contact Layer 3

Then, an n-side contact layer 3 made of n-type GaN doped with Si at a density of 1×10$^{19}$ atoms/cm$^3$ was grown to have a thickness of 6 μm on the underlayer 2 at a temperature of 1,150° C. using TMG, ammonia, and monosilane.

n-Side Superlattice Layer 4

Then, at a temperature of 860° C., an n-side superlattice layer 4 was formed by repeating a cycle of growing a GaN layer and an InGaN layer 30 times, as described below.

A GaN layer 4a was grown to have a thickness of 3 nm on the n-side contact layer using TEG and ammonia as the raw material gas and using N$_2$ gas as the carrier gas (step A1). It is noted that in Example 1, the description in which only a single kind of gas is used as the carrier gas indicates that the carrier gas consists of substantially only the single kind of gas, and substantially no other kinds of gas are contained in the carrier gas. That is, in the step A1, the carrier gas consists of substantially only N$_2$ gas. Then, an InGaN layer 4b was grown to have a thickness of 1 nm on the GaN layer using TEG, TMI, and ammonia as the raw material gas and using N$_2$ gas as the carrier gas (step B1).

A combination of the step A1 and the step B1 was taken as one cycle, and the cycle was repeated 27 times, i.e., from the first cycle to the twenty-seventh cycle.

In the twenty-eighth cycle, a GaN layer 4x was grown to have a thickness of 3 nm using TEG and ammonia as the raw material gas and using H$_2$ gas as the carrier gas (step A2). At this time, the flow rate of H$_2$ gas was set at 80 slm. In Example 1, in order to control the flow of a mixed gas composed of raw material gas and carrier gas at the growth surface of the substrate when growing the respective layers, control gas composed of N$_2$ gas was caused to flow from the obliquely upper side with respect to the growth surface of the substrate. Consequently, within the MOCVD reactor vessel, the raw material gas, the carrier gas, and the control gas are allowed to coexist. Meanwhile, the carrier gas containing the raw material gas was mainly blown on the growth surface of the substrate, and the control gas was not mainly brown thereto. Thus, even in the case where the control gas made of N$_2$ is used, the growth of the GaN layer 4x can be controlled as long as H$_2$ is used as the carrier gas. In the step A2 of Example 1, the flow rate of H$_2$ gas as the carrier gas was set at 80 slm, and the flow rate of N$_2$ gas as the control gas was set at 150 slm. That is, the ratio of the flow rate of H$_2$ gas to the total flow rate of H$_2$ gas and N$_2$ gas was set at approximately 35%.

Next, an InGaN layer 4s doped with Si at a density of 3×10$^{18}$ atoms/cm$^3$ was grown on the GaN layer using TEG, TMI, and ammonia as the raw material gas, monosilane as the n-type impurity gas, and N$_2$ gas as the carrier gas (step B2).

A combination of the step A2 and the step B2 was taken as one cycle, and the cycle was repeated 3 times, i.e., from the twenty-eighth cycle to the thirtieth cycle.

In the manner as described above, the superlattice layer including 30 GaN layers and 30 InGaN layers were formed. That is, the n-side superlattice layer 4 was formed where n was 30 and each of m and k was 27.

Active Layer 5

Next, a GaN layer doped with Si at a density of 4×10$^{18}$ atoms/cm$^3$ was grown to have a thickness of 6 nm, on the superlattice layer at a temperature of 930° C. using TEG, TMI, and ammonia as the raw material gas and using monosilane as the n-type impurity gas, and subsequently an undoped GaN layer was grown to have a thickness of 3 nm on the doped GaN layer. Further, a well layer made of In$_{0.25}$Ga$_{0.75}$N and a barrier layer made of GaN, which were taken as one pair, were alternately grown on the undoped GaN layer to obtain nine pairs. Specifically, each well layer was grown at a temperature of 800° C. to have a thickness of 3 nm using TEG, TMI, and ammonia as the raw material gas, and each barrier layer was grown at a temperature of 960° C. to have a thickness of 19 nm using TEG and ammonia as the raw material gas. In addition, on the nine pairs of the well layers and the barrier layers, a well layer made of In$_{0.25}$Ga$_{0.75}$N and a barrier layer made of GaN, which were taken as one pair, were alternately grown to obtain three pairs. Specifically, each well layer was grown at a temperature of 800° C. using TEG, TMI, and ammonia as the raw material gas to have a thickness of 3 nm, and each barrier layer was grown at a temperature of 960° C. using TEG and ammonia as the raw material gas to have a thickness of 16 nm. In this manner, the active layer 5 was formed.

p-Side Cladding Layer 6

Then, a p-side cladding layer 6, made of $Al_{0.13}Ga_{0.87}N$ doped with Mg at a density of $2\times10^{20}$ atoms/cm$^3$, was formed to have a thickness of 11 nm on the active layer 5 at a temperature of 930° C. using TEG, TMA, and ammonia as the raw material gas and Cp$_2$Mg (cyclopentadienyl magnesium) as the p-type impurity gas.

p-Side Contact Layer 7

Subsequently, a p-type contact layer 7 was formed by, at a temperature between approximately 850° C. and 1000° C., growing an undoped GaN layer on the p-side cladding layer and a doped p-type GaN layer doped with Mg at a density of $5\times10^{20}$ atoms/cm$^3$ on the undoped GaN layer. Specifically, the undoped GaN layer was grown to have a thickness of approximately 80 nm using TMG and ammonia, and the doped p-type GaN layer was grown to have a thickness of approximately 40 nm using TMG, ammonia, and Cp$_2$Mg.

After the growth, the substrate 1 with the nitride semiconductor formed thereon was subjected to annealing in a reactor vessel under a nitrogen atmosphere at a temperature of about 700° C., so that the resistance of each of the p-side cladding layer 6 and the p-side contact layer 7 is reduced.

After the annealing, a portion of each of the p-side contact layer 7, p-side cladding layer 6, and active layer 5 in the certain region were removed to expose the surface for forming the n-electrode 8 (i.e., electrode formation surface).

Then, the p-electrode 9 and the n-electrode 8 were formed on a portion of the surface of the p-side contact layer 7 and on the electrode formation surface, respectively.

In the nitride semiconductor light-emitting element of Example 1 manufactured in a manner as described above, the forward voltage Vf required to allow the forward current of 65 mA to flow therethrough was 3.30 V, and VL was 107.31. An average peak emission wavelength was 532.9 nm. As used herein, "VL" is an index representing the brightness of the nitride semiconductor light-emitting element, and the larger this value VL, the greater the brightness of the nitride semiconductor light-emitting element is, and the smaller the value VL, the smaller the brightness of the nitride semiconductor light-emitting element is. In the Example 1, VL was determined by allowing the electric current to flow between the p-electrode and the n-electrode of the nitride semiconductor light-emitting element formed on the substrate 1 using a prober, causing the nitride semiconductor light-emitting element to emit light, receiving the emitted light with a photodiode, and measuring. The VL value as used herein is an average value of VL values measured in a plurality of nitride semiconductor light-emitting elements formed on the substrate 1.

Example 2

A nitride semiconductor light-emitting element in Example 2 was manufactured in the same manner as in Example 1 except that the n-side superlattice layer 4 was formed in the manner as below.

n-Side Superlattice Layer 4

In Example 2, the step A1 was performed in each cycle from the first cycle to the twenty-sixth cycle, and the step B1 was performed in each cycle from the first cycle to the twenty-seventh cycle. Further, the step A2 was performed in each cycle from the twenty-seventh cycle to the thirtieth cycle, and the step B2 was performed in each cycle from the twenty-eighth cycle to the thirtieth cycle. That is, the n-side superlattice layer 4 was formed where n was 30, m was 26, and k was 27.

In the nitride semiconductor light-emitting element of Example 2, manufactured in the manner as described above, the forward voltage Vf required to allow the forward current of 65 mA to flow therethrough was 3.38 V, and VL was 106.97. An average peak emission wavelength was 531.6 nm.

Example 3

A nitride semiconductor light-emitting element in Example 3 was manufactured in the same manner as in Example 1 except for the n-side superlattice layer 4 formed as below.

n-Side Superlattice Layer 4

In Example 3, the step A1 was performed in each cycle from the first cycle to the twenty-fifth cycle, and the step B1 was performed in each cycle from the first cycle to the twenty-seventh cycle. Further, the step A2 was performed in each cycle from the twenty-sixth cycle to the thirtieth cycle, and the step B2 was performed in each cycle from the twenty-eighth cycle to the thirtieth cycle. That is, the n-side superlattice layer 4 was formed where n was 30, m was 25, and k was 27.

In the nitride semiconductor light-emitting element of Example 3, manufactured in the manner as described above, the forward voltage Vf required to allow the forward current of 65 mA to flow therethrough was 3.49 V, and VL was 109.52. An average peak emission wavelength was 532.2 nm.

Example 4

A nitride semiconductor light-emitting element in Example 4 was manufactured in the same manner as in Example 1 except that the n-side superlattice layer 4 was formed in the following way.

n-Side Superlattice Layer 4

In Example 4, the step A1 was performed in each cycle from the first cycle to the twenty-eighth cycle, and the step B1 was performed in each cycle from the first cycle to the twenty-seventh cycle. Further, the step A2 was performed in each cycle from the twenty-ninth cycle to the thirtieth cycle, and the step B2 was performed in each cycle from the twenty-eighth to the thirtieth cycles. That is, the n-side superlattice layer 4 was formed where n was 30, m was 28, and k was 27.

In the nitride semiconductor light-emitting element of Example 4, manufactured in the manner as described above, the forward voltage Vf required to allow the forward current of 65 mA to flow therethrough was 3.28 V, and VL was 105.53. An average emission peak wavelength was 530.3 nm.

Example 5

A nitride semiconductor light-emitting element in Example 5 was manufactured in the same manner as in Example 1 except for that the n-side superlattice layer 4 formed in the manner as described below.

n-Side Superlattice Layer 4

In Example 5, the step A1 was performed in each cycle from the first cycle to the twenty-ninth cycle, and the step B1 was performed in each cycle from the first cycle to the twenty-seventh cycle. Further, the step A2 was performed in the thirtieth cycle, and the step B2 was performed in each cycle from the twenty-eighth to the thirtieth cycles. That is, the n-side superlattice layer 4 was formed where n was 30, m was 29, and k was 27.

In the nitride semiconductor light-emitting element of Example 5, manufactured in the manner as described above, the forward voltage Vf required to allow the forward current of 65 mA to flow therethrough was 3.26 V, and VL was 102.95. An average peak emission wavelength was 529.5 nm.

Example 6

A nitride semiconductor light-emitting element in Example 6 was manufactured in the same manner as in Example 1 except for that the n-side superlattice layer 4 was formed as described below.
n-Side Superlattice Layer 4

In Example 6, the step B2 was performed in each cycle from the first cycle to the twenty-seventh cycle, and the step B1 was performed in each cycle from the first cycle to the twenty-eighth cycle. Further, the step A2 was performed in each cycle from the twenty-eighth cycle to the thirtieth cycle, and the step B2 was performed in each cycle from the twenty-ninth to the thirtieth cycle. That is, the n-side superlattice layer 4 was formed where n was 30, m was 27, and k was 28.

In the nitride semiconductor light-emitting element of Example 6, manufactured in the manner as described above, the forward voltage Vf required to allow the forward current of 65 mA to flow therethrough was 3.37 V, and VL was 106.92. An average peak emission wavelength was 528.1 nm.

Example 7

A nitride semiconductor light-emitting element in Example 7 was manufactured in the same manner as in Example 1 except that the n-side superlattice layer 4 was formed as described below.
n-Side Superlattice Layer 4

In Example 7, the step A1 was performed in each cycle from the first cycle to the twenty-seventh cycle, and the step B1 was performed in each cycle from the first cycle to the twenty-sixth cycle. Further, the step A2 was performed in each cycle from the twenty-eighth cycle to the thirtieth cycle, and the step B2 was performed in each cycle from the twenty-seventh to the thirtieth cycles. That is, the n-side superlattice layer 4 was formed where n was 30, m was 27, and k was 26.

In the nitride semiconductor light-emitting element of Example 7, manufactured as described above, the forward voltage Vf required to allow the forward current of 65 mA to flow therethrough was 3.30 V, and VL was 108.46. An average peak emission wavelength was 528.8 nm.

Example 8

A nitride semiconductor light-emitting element in Example 8 was manufactured in the same manner as in Example 1 except that the n-side superlattice layer 4 was formed as below.
n-Side Superlattice Layer 4

In Example 8, the step A1 was performed in each cycle from the first cycle to the twenty-seventh cycle, and the step B1 was performed in each cycle from the first cycle to the twenty-fifth cycle. Further, the step A2 was performed in each cycle from the twenty-eighth cycle to the thirtieth cycle, and the step B2 was performed in each step from the twenty-sixth cycle to the thirtieth cycle. That is, the n-side superlattice layer 4 was formed where n was 30, m was 27, and k was 25.

In the nitride semiconductor light-emitting element of Example 2, manufactured as described above, the forward voltage Vf required to allow the forward current of 65 mA to flow therethrough was 3.29 V, and VL was 109.75. An average peak emission wavelength was 527.1 nm.

Example 9:

A nitride semiconductor light-emitting element in Example 9 was manufactured in the same manner as in Example 1 except that the n-side superlattice layer 4 formed as below.
n-Side Superlattice Layer 4

In Example 9, the step A1 was performed in each cycle from the first cycle to the twenty-seventh cycle, and the step B1 was performed in each cycle from the first cycle to the thirtieth cycle. Further, the step A2 was performed in each step from the twenty-eighth cycle to the thirtieth cycle. That is, the n-side superlattice layer 4 was formed where n was 30, m was 27, and k was 30.

In the nitride semiconductor light-emitting element of Example 9, manufactured in the manner as described above, the forward voltage Vf required to allow the forward current of 65 mA to flow therethrough was 3.68 V, and VL was 107.30. An average peak emission wavelength was 530.3 nm.

Comparative Example 1

A nitride semiconductor light-emitting element in Comparative Example was manufactured in the same manner as in Example 1 except that an n-side superlattice layer was formed as below.
n-Side Superlattice Layer 4

In Comparative Example 1, the step A1 was performed in each cycle from the first cycle to the thirtieth cycles, and the step B1 was performed in each cycle from the first cycle to the twenty-seventh cycle. Further, the step B2 was performed in each cycle from the twenty-eighth cycle to the thirtieth cycle. That is, the n-side superlattice layer 4 was formed where n was 30, m was 30, and k was 27.

In the nitride semiconductor light-emitting element of Comparative Example 1, manufactured in the manner as described above, the forward voltage Vf required to allow the forward current of 65 mA to flow therethrough was 3.23 V, and VL was 97.60.

Table 1 shows the results of the structures and evaluation of the n-side superlattice layers in Examples 1 to 9 and Comparative Example 1, described above.

TABLE 1

| | Number of GaN growth layers in mixed gas (Number of performing step A2) | Number of InGaN layers doped with Si (Number of performing step B2) | Forward voltage Vf | Brightness VL |
|---|---|---|---|---|
| Example 1 | 3 | 3 | 3.30 | 107.31 |
| Example 2 | 4 | 3 | 3.38 | 106.97 |
| Example 3 | 5 | 3 | 3.49 | 109.52 |

TABLE 1-continued

|  | Number of GaN growth layers in mixed gas (Number of performing step A2) | Number of InGaN layers doped with Si (Number of performing step B2) | Forward voltage Vf | Brightness VL |
|---|---|---|---|---|
| Example 4 | 2 | 3 | 3.28 | 105.53 |
| Example 5 | 1 | 3 | 3.26 | 102.95 |
| Example 6 | 3 | 2 | 3.37 | 106.92 |
| Example 7 | 3 | 4 | 3.30 | 108.46 |
| Example 8 | 3 | 5 | 3.29 | 109.75 |
| Example 9 | 3 | 0 | 3.68 | 107.30 |
| Comparative Example 1 | 0 | 3 | 3.23 | 97.60 |

From the results shown in Table 1, (1) and (2) as below can be understood.
(1) Growing the GaN layers on the active layer 5 side in the n-side superlattice layer 4 using gas containing $H_2$ gas as the carrier gas allows for improving the brightness (based on the comparison between Examples 1 to 9 and Comparative Example 1).
(2) Doping n-type impurities into the InGaN layer on the active layer 5 side in the n-side superlattice layer 4 allows for reducing the forward voltage Vf (based on the comparison between Examples 1 to 8 and Example 9).

As shown in Examples 1 to 9 as described above, according to the nitride semiconductor light-emitting element of Examples 1 to 9, growing the GaN layers on the active layer 5 side in the n-side superlattice layer 4 using gas containing $H_2$ gas as the carrier gas allows for improving brightness of the light-emitting element. Further, doping n-type impurities into the InGaN layer on the active layer 5 side in the n-side superlattice layer 4 allows for improving the brightness of the light-emitting element and reducing the forward voltage Vf.

What is claimed is:

1. A method of manufacturing a nitride semiconductor light-emitting element, the method comprising:
   growing an n-side superlattice layer that includes InGaN layers and GaN layers; and
   after the step of growing the n-side superlattice layer, growing a light-emitting layer,
   wherein:
   the step of growing the n-side superlattice layer comprises:
      repeating a cycle n times (where n is a number of repetitions), the cycle including:
         growing one InGaN layer, and
         growing one GaN layer,
   in the step of growing the n-side superlattice layer:
      the step of growing one GaN layer in each cycle from a first cycle to a mth cycle is performed using gases consisting of:
         a raw material gas consisting of triethylgallium and ammonia, and
         a carrier gas consisting of $N_2$,
      the step of growing the InGaN layer in each cycle from the first cycle to a kth cycle is performed without supplying an n-type impurity gas,
      the step of growing the InGaN layer in each cycle from (k+1)th cycle to the nth cycle is performed while supplying an n-type impurity gas, and
      the step of growing one GaN layer in each cycle from a (m+1)th cycle to an nth cycle is performed using gas containing $H_2$ gas as the carrier gas.

2. The method of manufacturing a nitride semiconductor light-emitting element according to claim 1, wherein:
   a peak wavelength of the nitride semiconductor light-emitting element is in a range of 500 nm to 570 nm.

3. The method of manufacturing a nitride semiconductor light-emitting element according to claim 1, wherein:
   n is in a range of 20 to 40.

4. The method of manufacturing a nitride semiconductor light-emitting element according to claim 3, wherein:
   (n-m), which indicates a number of cycles from an (m+1)th cycle to the nth cycle, is in a range of 1 to 4.

5. The method of manufacturing a nitride semiconductor light-emitting element according to claim 3, wherein:
   (n-k), which indicates a number of cycles from (k+1)th cycle to the nth cycle, is in a range of 2 to 5.

6. The method of manufacturing a nitride semiconductor light-emitting element according to claim 4, wherein:
   (n-k), which indicates a number of cycles from (k+1)th cycle to the nth cycle, is in a range of 2 to 5.

7. The method of manufacturing a nitride semiconductor light-emitting element according to claim 1, wherein:
   m is greater than k.

8. The method of manufacturing a nitride semiconductor light-emitting element according to claim 1, wherein:
   the GaN layer has a thickness of 1.5 nm to 5 nm.

9. The method of manufacturing a nitride semiconductor light-emitting element according to claim 1, wherein:
   the InGaN layer has a thickness of 0.5 nm to 3 nm.

10. The method of manufacturing a nitride semiconductor light-emitting element according to claim 1, wherein:
    the step of growing one GaN layer in each cycle from a (m+1)th cycle to an nth cycle is performed using gases comprising:
       a raw material gas comprising triethylgallium and ammonia,
       a control gas comprising $N_2$, and
       a carrier gas comprising $H_2$.

11. The method of manufacturing a nitride semiconductor light-emitting element according to claim 1, wherein:
    the step of growing one GaN layer in each cycle from a (m+1)th cycle to an nth cycle is performed using gases consisting of:
       a raw material gas consisting of triethylgallium and ammonia,
       a control gas consisting of $N_2$, and
       a carrier gas consisting of $H_2$.

* * * * *